US007235483B2

(12) United States Patent
Ivanov

(10) Patent No.: US 7,235,483 B2
(45) Date of Patent: Jun. 26, 2007

(54) METHOD OF ELECTROLESS DEPOSITION OF THIN METAL AND DIELECTRIC FILMS WITH TEMPERATURE CONTROLLED STAGES OF FILM GROWTH

(75) Inventor: Igor C. Ivanov, Dublin, CA (US)

(73) Assignee: Blue29 LLC, Sunnyvale, CA (US)

( * ) Notice: Subject to any disclaimer, the term of this patent is extended or adjusted under 35 U.S.C. 154(b) by 0 days.

(21) Appl. No.: 10/299,070

(22) Filed: Nov. 19, 2002

(65) Prior Publication Data
US 2004/0097071 A1 May 20, 2004

(51) Int. Cl.
*H01L 21/44* (2006.01)
(52) U.S. Cl. ............ 438/678; 427/437; 427/443.1
(58) Field of Classification Search ............ 438/678; 427/437, 443.1
See application file for complete search history.

(56) References Cited

U.S. PATENT DOCUMENTS

| 5,500,315 A | 3/1996 | Calvert et al. |
| 5,830,805 A * | 11/1998 | Shacham-Diamand et al. .. 438/678 |
| 5,950,723 A * | 9/1999 | Heimanson et al. ........ 165/275 |
| 6,309,524 B1 | 10/2001 | Woodruff et al. |
| 2002/0086102 A1* | 7/2002 | Grunwald ............ 427/98 |
| 2003/0235983 A1* | 12/2003 | Li et al. ............ 438/678 |
| 2004/0052963 A1* | 3/2004 | Ivanov et al. ........... 427/443.1 |
| 2004/0058468 A1* | 3/2004 | Takahashi et al. ........... 438/42 |

FOREIGN PATENT DOCUMENTS

WO  WO 02/34962  5/2002

OTHER PUBLICATIONS

U.S. Appl. No. 10/103,105, filed Mar. 22, 2002, Ivanov et al.
U.S. Appl. No. 10/247,895, filed Sep. 20, 2002, Ivanov et al.
"Electroless Nickel Plating", Finishing publications Ltd, 1991, W. Riedel, p. 39.
Y. Lantasov et al. "Microelectronics EngineeRing", No. 50 (2000), pp. 441-447, Fig. 2.
S.Lopatin , AMC, 2001.
International Search Report, PCT/US03/36735, mailed Oct. 13, 2004.

* cited by examiner

*Primary Examiner*—Lynne A. Gurley
(74) *Attorney, Agent, or Firm*—Mollie E. Lettang; Daffer McDaniel, LLP

(57) ABSTRACT

The method of the invention comprises accumulating experimental data or obtaining existing data with regard to the optimal time-temperature relationship of the deposition process on various film-formation stages for various materials, forming nuclei of a selected material on the surface of the treated object in the first stage under first temperature-controlled conditions for the formation of nuclei of said selected material, converting the nuclei of the aforementioned selected material into island-structured deposited layer of said material by causing lateral growth of the nuclei under second temperature-controlled conditions; converting the island-structure layer into a continuously interconnected cluster structure by causing further lateral growth of said island-structured deposited layer under third temperature-controlled conditions; forming a first continuous film of said material under fourth temperature controlled conditions which provides said first continuous film with predetermined properties; and then completing the formation of a final coating film by growing at least one subsequent continuous film of said material under fifth temperature-controlled conditions until a film of a predetermined thickness is obtained. The fifth temperature-controlled conditions may be characterized by a pulse-mode or step-like variations of temperature in time with rapid cooling or heating for obtaining high degree of crystallinity or for increase in the rate of deposition. The method of the invention could be realized with the use of the electroless deposition apparatus with instantaneous cooling or heating of the object, e.g., a semiconductor substrate, in a deposition chamber.

19 Claims, 7 Drawing Sheets

METHOD OF ELECTROLESS DEPOSITION OF THIN METAL AND DIELECTRIC FILMS WITH TEMPERATURE CONTROLLED STAGES OF FILM GROWTH

FIELD OF THE INVENTION

The invention relates to the formation of thin films on surfaces of objects, more particularly to electroless deposition of very thin metal or dielectric films on substrates. The method and apparatus of the invention may find application in the manufacture of semiconductor devices, in particular integrated circuits.

BACKGROUND OF THE INVENTION

Manufacturing of semiconductor devices, in particular integrated circuits having multiple-layered structures with various metal and non-metal layers laminated on a semiconductor substrate, typically involves application of several metal layers onto a substrate or onto other previously deposited layers. These layers may have a complicated planar topology since these layers may constitute thousands of individual devices, which in combination form an integrated circuit or so-called "chip". Modern chips may have metal or dielectric layers with thickness from tens of Angstroms to fractions of a micron.

It is understood that thin metallic films used in integrated circuits of semiconductor devices function as conductors of electric current. Furthermore, it is known that densities of signal currents in metallic interconnections used in integrated circuit may reach extremely high values that generate such phenomena as electromigration associated with spatial transfer of mass of conductor films. Therefore the characteristics and properties of the deposited metal films (uniformity of film thickness, low electrical resistivity, etc.) determine performance characteristics and quality of the integrated circuit and of the semiconductor device as a whole.

In view of the above, thin metal films used in the integrated circuits should satisfy very strict technical requirements relating to metal deposition processes, as well as to repeatability and controllability of the aforementioned processes.

A wide range of metals is utilized in the microelectronic manufacturing industry for the formation of integrated circuits. These metals include, for example, nickel, tungsten, platinum, copper, cobalt, as well as alloys of electrically conductive compounds such as silicides, solders, etc. It is also known that coating films are applied onto substrates with the use of a variety of technological processes such chemical vapor deposition (CVD), physical vapor deposition (PVD), electroplating, and electroless plating. Of these techniques, electroplating and electroless plating or deposition tend to be the most economical and most promising for improvement in characteristics of the deposited films. Therefore, electroplating and electroless plating techniques successfully replaces other technologies.

Electroplating and electroless plating can be used for the deposition of continuous metal layers as well as patterned metal layers. One of the process sequences used by the microelectronic manufacturing industry to deposit metals onto semiconductor wafers is known to as "damascene" processing. In such processing, holes, commonly called "vias", trenches and/or other recesses are formed on a workpiece and filled with a metal, such as copper. In the damascene process, the wafer, with vias and trenches etched in the dielectric material, is first provided with a metallic seed layer, which is used to conduct electrical current during a subsequent metal electroplating step. If a metal such as copper is used, the seed layer is disposed over a barrier layer material, such as Ti, TiN, etc. The seed layer is a very thin layer of metal, which can be applied using one or more processes. For example, the seed layer of metal can be laid down using physical vapor deposition or chemical vapor deposition processes to produce a layer with the thickness on the order of 1,000 Angstroms. The seed layer can advantageously be formed of copper, gold, nickel, palladium, or other metals. The seed layer is formed over a surface, which may contain vias, trenches, or other recessed device features.

A metal layer is then electroplated onto the seed layer in the form of a continuous layer. The continuous layer is plated to form an overlying layer, with the goal of providing a metal layer that fills the trenches and vias and extends a certain amount above these features. Such a continuous layer will typically have a thickness on the order of 5,000 to 15,000 Angstroms (0.5–1.5 microns).

After the continuous layer has been electroplated onto the semiconductor wafer, excess metal material present outside of the vias, trenches, or other recesses is removed. The metal is removed to provide a resulting pattern of metal layer in the semiconductor integrated circuit being formed. The excess plated material can be removed, for example, using chemical mechanical planarization. Chemical mechanical planarization is a processing step, which uses the combined action of chemical removal agents, or a chemical removal agents with an abrasive, which grinds and polishes the exposed metal surface to remove undesired parts of the metal layer applied in the electroplating step.

Disadvantages associated with electroplating are technical problems in connection with designing of reactors used in the electroplating of semiconductor wafers. Utilization of a limited number of discrete electrical contacts (e.g., 8 contacts) with the seed layer about the perimeter of the wafer ordinarily produces higher current densities near the contact points than at other portions of the wafer. This non-uniform distribution of current across the wafer, in turn, causes non-uniform deposition of the plated metallic material. Current thieving, affected by the provision of electrically conductive elements other than those, which contact the seed layer, can be employed near the wafer contacts to minimize such non-uniformity. But such thieving techniques add to the complexity of electroplating equipment, and increase maintenance requirements.

The specific metal to be electroplated can also complicate the electroplating process. For example, electroplating of certain metals typically requires use of a seed layer having a relatively high electrical resistance. As a consequence, use of the typical plurality of electrical wafer contacts (for example, eight discrete contacts) may not provide adequate uniformity of the plated metal layer on the wafer. Reduction in sizes of such features as vias and trenches also requires thinner layers having higher resistivity, which in turn may generate a high potential drop from the wafer edges to the central part, whereby the rate of deposition in the central area is significantly reduced.

Beyond the problems discussed above, there are also other problems associated with electroplating reactors. As device sizes decrease, the need for tighter control over the processing environment increases. This includes control over the contaminants that affect the electroplating process.

The moving components of the reactor, which tend to generate such contaminants, should therefore be subject to strict isolation requirements.

Still further, existing electroplating reactors are often difficult to maintain and/or reconfigure for different electroplating processes. Such difficulties must be overcome if an electroplating reactor design is to be accepted for large-scale manufacturing.

One drawback associated with copper deposition by electroplating is the fact that for very small features on microelectronic workpieces (sub 0.1 micron features), copper deposition by electroplating can lack conformity with the side walls of high aspect ratio vias and trenches, and can produce voids in the formed interconnects and plugs (vias). This is often due to the non-conformity of the copper seed layer deposited by PVD or CVD. As a result, the seed layer may not be thick enough to carry the current to the bottom of high aspect ratio features.

An alternate process for depositing copper onto a microelectronic workpiece is known as "electroless" plating which is the deposition of metals on a catalytic surface from a solution without an external source of current. For example, this process can be used as a preliminary step in preparing plastic articles for conventional electroplating. After cleaning and etching, the plastic surface is immersed in solutions that react to precipitate a catalytic metal in situ, palladium, for example. First the plastic is placed in an acidic stannous chloride solution, then into a solution of palladium chloride; palladium is reduced to its catalytic metallic state by the tin. Another way of producing a catalytic surface is to immerse the plastic article in a colloidal solution of palladium followed by immersion in an accelerator solution. The plastic article thus treated can now be plated with nickel or copper by the electroless method, which forms a conductive surface, which then can be plated with other metals by a conventional electroplating method.

Along with the electroplating method, the electroless method also has found wide application in the manufacture of semiconductor devices.

As compared to electroplating, the electroless plating or deposition is a selective process, which can be realized with very thin seeds or without the use of seeds at all. Since electroless process is not associated with the use of electric current, the electroless deposition results in more uniform coatings in view of the absence of discrete contacts. Electroless deposition can be realized with the use of simple and inexpensive equipment and with a high aspect ratio gap fill.

Given below are several examples of methods and apparatuses for electroless deposition, specifically for use in the manufacture of semiconductor devices.

U.S. Pat. No. 5,500,315 issued in 1996 to J. Calvert, et al. discloses an electroless metal plating-catalyst system that overcomes many of the limitations of prior systems. In one aspect of the invention, the process comprises the steps of: providing a substrate with one or more chemical groups capable of ligating to an electroless deposition catalyst, at least a portion of the chemical groups being chemically bonded to the substrate; contacting the substrate with the electroless metal plating catalyst; and contacting the substrate with an electroless metal plating solution to form a metal deposit on the substrate. The chemical groups can be, for example, covalently bonded to the substrate. In another preferred aspect, the invention provides a process for selective electroless metallization, comprising steps of selectively modifying the reactivity of a substrate to an electroless metallization catalyst; contacting the substrate with the electroless metallization catalyst; and contacting the substrate with an electroless metallization solution to form a selective electroless deposit on the substrate. The substrate reactivity can be modified by selective treatment of catalyst ligating groups or precursors thereof on the substrate, for example by isomerization, photocleavage or other transformation of the ligating or precursor groups. Such-direct modification enables selective plating in a much more direct and convenient manner than prior selective plating techniques. Specifically, the aforementioned patent provides selective electroless deposition without the use of a photoresist or an adsorption type tin-containing plating catalyst.

The method described in the above patent includes an electroless catalyst system that requires fewer and simpler processing steps in comparison to current Pd/Sn colloid catalyst adsorption based systems; use of more stable and convenient catalysts, including tin-free catalysts; and improved catalyst adhesion to a substrate allowing plating of more dense initiation and of greater uniformity and selectivity. The invention also provides selective patterning of substrate ligating groups, thereby enabling a selective metal deposit without the use of a conventional photoresist patterning sequence.

U.S. Pat. No. 6,309,524 granted to D. Woodruff, et al. in 2001 discloses a universal electroplating/electroless reactor for plating a metal onto surfaces of workpieces. An integrated tool for plating a workpiece comprises a first processing chamber for plating the workpiece using an electroless deposition process and a second processing chamber for plating the workpiece using an electroplating process. A robotic transfer mechanism is used that is programmed to transfer a workpiece to the first processing chamber for electroless deposition thereof and, in a subsequent operation, to transfer the workpiece to the second processing chamber for electroplating thereof.

It should be noted that a common problem in using bathes, which is especially true for the electroless deposition process, is that foreign particles or contaminants will be deposited on the substrate surface of the wafer when transferring the wafers from one bath to another bath. Another common problem is the exposure of the substrate surface of the wafer to air during the transfer (from bath to bath) can cause the non-wetting of deep and narrow trenches in the surface or small (contact) holes in the surface because of electrolyte evaporation. And yet another common problem is that exposure to air may cause oxidation of the catalytic surface that will result in poor catalytic activity and poor quality metal deposits. This problem becomes especially troublesome when using materials such as copper that easily oxidize in air. To produce high quality metal deposits in the submicron range, therefore, it is more desirable not to transfer the wafer between the processing chambers and to avoid exposing the wafer to air by using a single bath or processing chamber and moving the different fluids for each step in the process through the processing chamber.

The above problems are solved by the system described in U.S. Pat. No. 5,830,805 issued in 1998 to Y. Shacham-Diamand, et al. This patent discloses an electroless deposition apparatus and method of performing electroless deposition for processing a semiconductor wafer that use a closed processing chamber to subject the wafer to more than one processing fluid while retaining the wafer within the chamber. The invention is useful for manufacturing processes that include depositing, etching, cleaning, rinsing, and/or drying. The processing chamber used in the preferred embodiment of the apparatus of the above patent is an enclosed container capable of holding one or more semiconductor wafers. A distribution system introduces a first fluid into the chamber for processing the wafer and then removes the first fluid from the chamber after processing the wafer. The distribution system then introduces the next fluid into the chamber for processing the wafer and then removes the next fluid from the chamber after processing the wafer. This procedure continues until the manufacturing process finishes. The fluids used in the present invention depends on the process performed and may include fluids such as DI water, $N_2$ for flushing, and electrolytic solutions comprising reducing agents, complexing agents, or pH adjusters.

The fluid enters the sealed processing chamber through an inlet, and exits the chamber through an outlet. As the fluid enters the processing chamber, the fluid is dispersed across the wafer in a uniform flow. A recirculation system moves the fluid through the processing chamber using a temperature control system, chemical concentration monitoring system, pump system, and a filtration system before re-circulating the fluid back through the processing chamber.

Additional embodiments include: a rotatingly mounted tubular wafer housing with a wafer mounted on either or both sides of the housing surface; an inner core mounted inside of the tubular housing when mounting a wafer on the inside surface of the housing; and a dispersal apparatus for dispersing the fluid in a uniform flow over the wafer. The processing chamber can be provided with a heater and a temperature control system.

In spite of their advantages, the known electroless processes have temperature of the working chemical solution as one of the main parameters. It is known that speed of deposition in an electroless process depends on the temperature in a degree close to exponential. For example, in the article published in "Electroless Nickel Plating, Finishing Publications Ltd., 1991, W. Riedel states (page 39 of the article) that temperature is the most important of parameters affecting the deposition rate and that for Ni—P electroless process the deposition rate increases twofold for every 10 degrees of bath temperature.

Furthermore, for the metal interconnects on the surface of the wafer one of the major requirements is low resistivity. Copper was chosen as the close second best for fulfilling this requirement. However, due to the presence of various additives in the interface between the PVD Cu seeds and ECD [electroplating copper deposition] Cu, resistivity is disproportionally increased as compared to the one in much thinner electroless-deposited Cu layer. This phenomenon was reported by S. Lopatin at AMC, 2001.

It has been also shown by Y. Lantasov, et al. in "Microelectronics Engineering", No. 50 (2000), pp. 441–447, FIG. 2, that resistivity of ELD Cu strongly depends on deposition conditions, and that at higher temperatures it is possible to obtain a material with low resistivity.

However, it is understood that electroless deposition at high temperatures leads to significant non-uniformities in the deposited layers. This occurs due to local temperature fluctuations. The higher is the temperature, the greater are such fluctuations. Stabilization of elevated temperatures in large volumes of the solution tanks is associated with the use of complicated temperature control systems and temperature maintaining systems (seals, thermal insulations, etc.). This, in turn, increases the cost of the equipment and maintenance.

For the reasons described above, manufacturers of semiconductor equipment prefer to use electroless processes carried out at room temperature. Low speeds of deposition are compensated by utilizing a multiple-station deposition equipment with simultaneous operation of a number of substrates in a number of chambers arranged in series. Such equipment requires a large production space and dictates the use of large volumes of the solutions. Furthermore, an additional space is needed for the preparation, storage, and post-use treatment of the solutions. This, in turn, creates environmental problems.

Another common drawback of existing electroless deposition apparatuses is low speed of deposition, which in general depends on the type of the deposited material and even in the best case does not exceed 100 nm/min, but normally is much lower. For example, for CoWP the speed of deposition can be within the range from 5 nm/min to 10 nm/min.

In earlier U.S. patent application Ser. No. 103,015 filed on Mar. 22, 2002, the applicants have substantially solved the problems of electroplating and electroless deposition associated with processes and apparatuses described above. More specifically, the apparatus described in the aforementioned patent application has a closable chamber that can be sealed and is capable of withstanding an increased pressure and high temperature. The chamber contains a substrate holder, that can be rotated around a vertical axis, and an edge-grip mechanism inside the substrate holder. The deposition chamber has several inlet ports for the supply of various process liquids, such as deposition solutions, DI water for rinsing, etc., and a port for the supply of a gas under pressure. The apparatus is also provided with reservoirs and tanks for processing liquids and gases, as well as with a solution heater and a control system for controlling temperature and pressure in the chamber. The heater can be located outside the working chamber or built into the substrate holder, or both heaters can be used simultaneously. Uniform deposition is achieved by carrying out the deposition process under pressure and under temperature slightly below the boiling point of the solution. The solution can be supplied from above via a showerhead formed in the cover, or through the bottom of the chamber. Rinsing or other auxiliary solutions are supplied via a radially moveable chemical dispensing arm that can be arranged above the substrate parallel thereto.

Furthermore, the apparatus of aforementioned U.S. patent application Ser. No. 103,015 provides uniform heating of the entire working solution by means of a heater located either outside of the deposition chamber with heating of the solution on the way to the chamber, or inside the cover of the deposition chamber. The main idea is to maintain the entire volume of the working solution at a uniform temperature. In general, the temperature can be adjusted, but should remain constant and at a relatively high level (e.g., 80 to 90° C.) all the time. However, although an elevated temperature of the working solution leads to essential increase in the productivity of the deposition process, the process requires constant replacement of the working solution since high temperature causes rapid thermal decomposition of the solution. Constant replacement of the solution should be carried out with high flow rates, and this, in turn, increases the cost of the production.

The undesired effect of permanent high temperature on the working solution can be explained as follows:

The electroless deposition is a process of reduction of metal ions, e.g., cobalt, tungsten, or the like, on the catalytically-active surface by electrons released during oxidation of a reducing agent (e.g., hypophosphite anions). Oxidation of the reducing agent is catalyzed by a substrate, and, in the case of the most widely accepted model, it can be assumed that the charge from the reducing agent is transferred to metal ions through the substrate and thus produces metal atoms on the substrate surface.

A simplified combined chemical reaction for the above process can be expressed as follows:

$$H_2PO_2^- + H_2O + Co^{++} = Co_o + H^+ + H_2PO_3$$

The reducing agent is consumed by deposition of metal on the processed part, by hydrolysis at high temperature (especially on hot spots of heating elements), by catalytic oxidation on particles generated by the deposition tool hardware, and by a reaction of reducing agent with reactive components (such as ethylene bonds, carboxyl groups, etc.) of the polymers used in tool construction.

At sufficiently high concentration of contamination particles and/or at the boiling point of the solution, the composition can be spontaneously and completely decomposed by metal reduction at the surfaces of the aforementioned particles (and defects). As soon as few metal atoms are formed, they become new nucleation sites for further continuous decomposition of the solution.

International Patent Application Publication No. WO 02/34962 (hereinafter referred to as International Application) disclosed on May 2, 2002 describes an electroless apparatus, in which the problem of thermal decomposition of the working solution is partially solved by utilizing a substrate holder with a heating device. The substrate holder of this apparatus has a substrate chuck for clamping the substrate during deposition in the working chamber in a position of the treated surface facing down.

The main disadvantage of the apparatus of the aforementioned International Application is that the substrate is oriented with the treated surface facing down. It is known that in a static condition of the solution or in processes with low-velocity flows of the solution, the aforementioned orientation of the substrate leads to accumulation of gas bubbles on the treated surface. The gas bubbles, in turn, violate conditions required for uniformity of deposition. In order to solve this problem, in the apparatus of the International Application the deposition chamber has a curvilinear bottom surface for guiding the flows of the working solution in specific paths over the facing-down surface of the substrate. However, even though the flows of the working solution generate some dynamic conditions on the edge surfaces of the substrate, a certain stagnation point will always remain in the central part of the substrate. This local area may accumulate gas bubbles. Furthermore, differential of velocities of the flow on the substrate surface may lead to non-uniform temperature distribution. In other words, the apparatus of the International Application does not provide uniformity of electroless deposition.

In order to eliminate problems associated with accumulation of gas bubbles and stagnation of the solution in the central area of the chuck, one of the embodiments of the aforementioned apparatus includes a complicated kinematic system with wobbling motions of the rotating chuck. Such a complicated system makes the apparatus and products more expensive, while the process becomes difficult to control.

The above problem was solved with the use of an electroless method and apparatus disclosed in another earlier U.S. patent application Ser. No. 247,895 filed by the same applicants on Oct. 20, 2002. More specifically, the above application relates to a method and apparatus for electroless deposition of a coating material, which may be a metal, semiconductor, or dielectric, that is carried out at a relatively low temperature of the working solution compensated by an increased temperature on the substrate which is controlled by a heater built into the substrate chuck. A decrease in the temperature of the working solution prevents thermal decomposition of the solution and reduces formation of gas bubbles, normally generated at increased temperatures. Accumulation of bubbles on the surface of the substrate is further prevented due to upwardly-facing orientation of the treated surface of the substrate. The substrate holder is equipped with a substrate heater and a substrate cooler, that can be used alternatingly for quick heating or cooling of the substrate surface. In addition to the thermally-controlled substrate holder, the apparatus of the invention is provided with oscillating nozzles located in the deposition chamber above the treated surface and used for rapid and uniform wetting of the entire treated surface of the substrate at the initial stage of filling of the working chamber with the solution.

In spite of the advantages provided by the last-mentioned invention, the method of thermally-controlled electroless deposition disclosed in the above application does not takes into account the specificity of the formation of a coating film on various stages of the film-growth process and therefore does not use to full extent all the technological possibilities of the apparatus disclosed in the above application.

OBJECTS AND SUMMARY OF THE INVENTION

It is an object of the present invention to provide a method of electroless deposition of very thin films of high uniformity without thermal decomposition of the working solution with accurate control of the process depending on the condition of the film structure on various stages of the deposition processing. It is another object is to provide a method for electroless deposition with impulse heating and cooling for optimization of the structure of the film obtained in various stages of the deposition. Still another object is to provide a method for electroless deposition with the most efficient use of an electroless-deposition apparatus that allows instantaneous heating and cooling of the substrate. A further object is to provide a method that results in the formation of thin deposition films of high uniformity and of the highest quality.

The method of the invention comprises accumulating experimental data or obtaining existing data with regard to the optimal time-temperature relationship of the deposition process on various film-formation stages for various materials, forming nuclei of a selected material on the surface of the treated object in the first stage under first temperature-controlled conditions for the formation of nuclei of said selected material, converting the nuclei of the aforementioned selected material into island-structured deposited layer of said material by causing lateral growth of the nuclei under second temperature-controlled conditions; converting the island-structure layer into a continuously interconnected cluster structure by causing further lateral growth of said island-structured deposited layer under third temperature-controlled conditions; forming a first continuous film of said material under fourth temperature controlled conditions which provides said first continuous film with predetermined properties; and then completing the formation of a final coating film by growing at least one subsequent continuous film of said material under fifth temperature-controlled conditions until a film of a predetermined thickness is obtained. The fifth temperature-controlled conditions may be characterized by a pulse-mode or step-like variations of temperature in time with rapid cooling or heating for obtaining high degree of crystallinity or for increase in the rate of deposition. The method of the invention could be realized with the use of the electroless deposition apparatus with

DETAILED DESCRIPTION OF THE INVENTION

Figure 1:
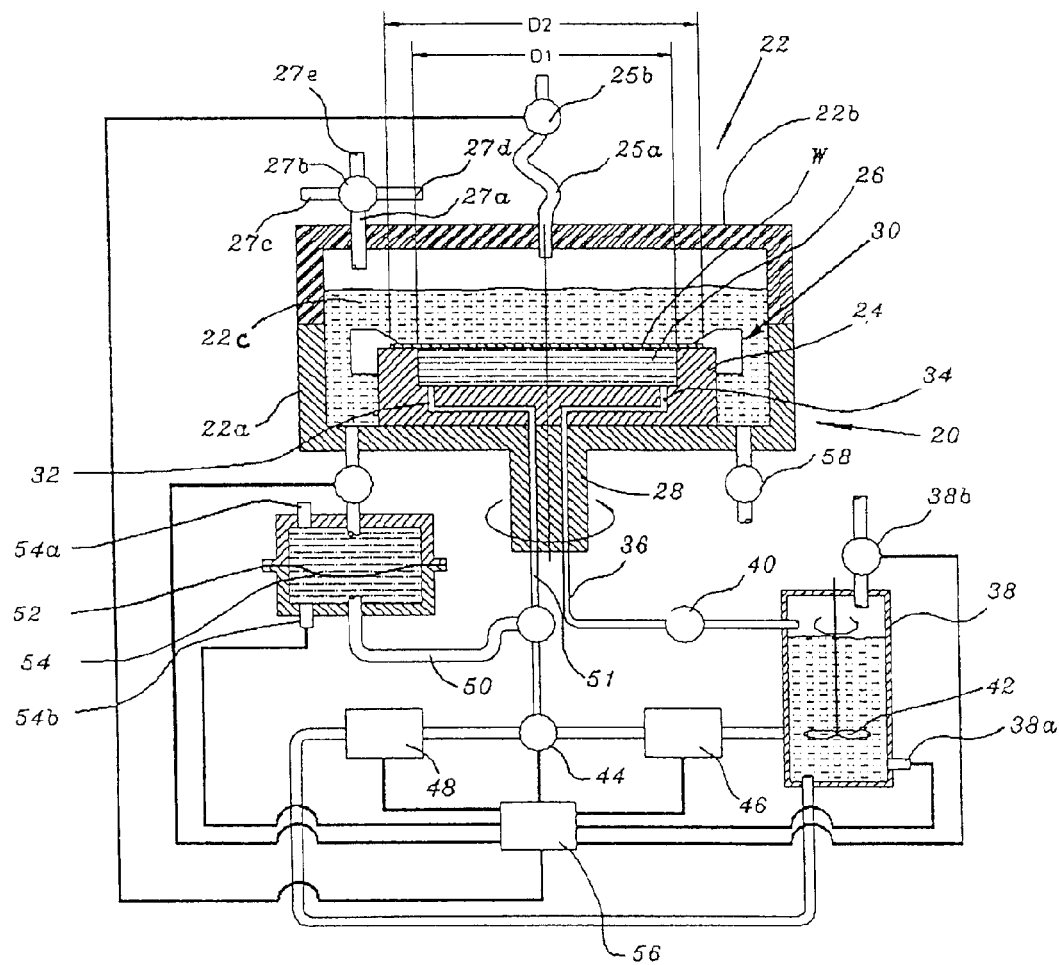
FIG. 1 is a schematic vertical cross-sectional view of an electroless deposition apparatus suitable for carrying out a method of the invention.

For better understanding of the principle of the invention, let us first consider in some detail a mechanism of film formation in electroless deposition processes.

Formation of thin films in electroless deposition, which in fact can be classified as a heterophasal (solid and liquid phases) epithaxy (LPD) and in a gaseous phase epithaxy (CVD, MOCVD, etc.), have similarity from the point of view of the film formation mechanisms (see Physical Chemistry of Surfaces, Fifth edition, by Arthur W. Adamson, John Wiley & Sons, Inc. Publishers, 1990, pp. 421–459).

Although a majority of publications available in the literature relates mostly to analysis of deposition from a gas phase, and much fewer works are dedicated to processes of deposition from a liquid phase, the available information is sufficient for understanding main mechanisms acting during the formation of thin films by deposition from a liquid phase. More specifically, the film-growth process can be characterized by three main mechanisms of growth, which can be characterized by an energetic parameter $\gamma(\gamma=\sigma_{fl}+\sigma_{fs}-\sigma_{sl}$, where $\sigma_{fp}$ is a specific surface energy on the film-liquid interface, $\sigma_{fs}$ is a specific surface energy on the film-substrate interface, and $\sigma_{ls}$ is a specific surface energy on the substrate-liquid interface).

If $\gamma$ is less than 0, i.e., in the case of strong interaction between the film and the substrate, the film is growing in a layer-by-layer manner. Each layer is formed with lateral growth of two-dimensional nuclei spreading over the surface of the preceding layer. Such mechanism is typical in the deposition of a metal film onto a metal surface. The first-layer film may be preliminarily formed on a non-metal substrate, e.g., on a silicon oxide layer. The subsequent layers will then grow as described above. In addition to $\gamma<0$, the heteroepithaxial growth requires at least an approximate match between crystalline lattices of the substrate and the material of the deposited film.

If the interaction between the film and the substrate is weak ($\gamma>0$), the first stage of the film growth constitutes formation of isolated "islands" of the deposited material. Further growth of these islands leads to the formation of a continuous coating layer. The aforementioned island-formation mechanism, which is also known as the Volmer-Weber mechanism, occurs in the formation of coating films from metals with high energy of cohesion, such Ag, Au, Cu, Ni, on substrates with low energy of cohesion, such as glass, silicon oxide, etc.

There can be an intermediate case when the energetic conditions of the process causes growth of the film in a layer-by-layer manner, and after the formation of one or more highly-stressed layers the continuity of the film is violated and further growth of the film continues in an island pattern. Such mechanism often occurs in some practically important systems with deposition of metal onto metal or metal onto semiconductor.

Thus, depositions of films from a liquid phase onto a solid substrate pass through a number of sequential stages which are characterized by specific features, i.e., after a short-term period of formation of nuclei, the growth is converted into an island-formation stage. In the island-formation stage, the islands grow as a certain statistical ensemble of interacting objects subordinate to a specific statistical law. This stage determines the structure of the future film and hence the film properties.

The next step in the film-growth mechanism is formation of a continuous cluster structure composed of interconnected islands. This stage designates transition from the isolated-island structure to a continuous structure electrically conductive for metal films. The above transition occurs very rapidly and in fact is a percolation transition in a two-dimensional system of randomly-arranged elements.

In the cluster-formation stage, film-growth tendencies, morphology, and physical properties of the growing film could be understood by considering the film as a random two-dimensional lattice. It is understood that the cluster-formation stage continues until a continuous film is formed. At the end of the cluster-formation stage, the film acquires a structure interweaved with a labyrinth of micropores which may determine the microrelief of the continuous films formed on the subsequent stages.

It is understood that different stages have different kinetics of the process. As has been mentioned above (see, e.g., Y. Lantasov, et al. in "Microelectronics Engineering", No. 50 (2000), pp. 441–447), by varying parameters of a liquid heterophaseous, it becomes possible to control a degree of crystallization in the deposited films. Probably, with this approach it would be possible to obtain films with structures in a wide range from fully amorphous to strictly crystalline. Such films with high degree of crystallization are most valuable from the practical point of view due to high stability of their properties. Therefore, in the formation of coating films, it would be advantageous to maintain film-growth conditions that would provide high-degree of crystallization in the deposited films.

The above considerations can be summarized as follows:
1) A process of liquid heterophaseous epitaxial growth of films can be roughly divided into several stages with specific mechanisms of growth.
2) Durations and film-growth rates may be significantly different in different stages, sometimes with a factor of 100.
3) Each stage has its own optimal conditions which may not be optimal in other stages.

4) In order to obtain coaling films with controlled and highest characteristics and properties (such as dispersivity, crystallinity, spatial stoichiometric uniformity, thickness uniformity, etc.), the film-formation process should be optimized individually in each specific stage of this process with reference to the specific conditions of this process.

The method of the invention comprises accumulating experimental data or obtaining existing data with regard to the optimal time-temperature relationship of the deposition process on various film-formation stages for various materials, forming nuclei of a selected material on the surface of the treated object in the first stage under first temperature-controlled conditions for the formation of nuclei of said selected material, converting the nuclei of the aforementioned selected material into island-structured deposited layer of said material by causing lateral growth of the nuclei under second temperature-controlled conditions; converting the island-structure layer into a continuously interconnected cluster structure by causing further lateral growth of said island-structured deposited layer under third temperature-controlled conditions; forming a first continuous film of said material under fourth temperature controlled conditions which provides said first continuous film with predetermined properties; and then completing the formation of a final coating film by growing at least one subsequent continuous film of said material under fifth temperature-controlled conditions until a film of a predetermined thickness is obtained. The fifth temperature-controlled conditions may be characterized by a pulse-mode or step-like variations of temperature in time with rapid cooling or heating for obtaining high degree of crystallinity or for increase in the rate of deposition. The method of the invention could be realized with the use of the electroless deposition apparatus with instantaneous cooling or heating of the object, e.g., a semiconductor substrate, in a deposition chamber.

In the context of the present invention, the term "instantaneous" means time required for changing the temperature of a treated object, e.g., a semiconductor substrate. In an electroless deposition process, such instantaneous change may occur during a time interval from fractions of a second to several seconds. As compared to the total time of the process (up to several minutes), the heating or cooling for fractions of seconds may be considered very rapid or instantaneous.

The apparatus for realization of the method is beyond the scope of the present invention and is described in aforementioned earlier U.S. patent application Ser. No. 247,895.

For description of the method, it would be advantageous first to consider the structure of the aforementioned apparatus, which is incorporated herein as a reference.

FIG. 1 is a schematic vertical cross-sectional view of an electroless deposition apparatus 20. Only those parts and units of this apparatus will be described in this application. The apparatus 20 has a sealable working chamber 22 which has a lower cup-shaped part 22a with an open part facing upward and a moveable upper cup-shaped part 22b with its open facing down towards the opening of the lower part 22a. In a closed state shown in FIG. 1, both parts 22a and 22b of the working chamber 22 form a sealed space 22c.

Reference numeral 25a designates a first gas supply pipe, and reference numeral 25b designates a pressure control valve for controlling gas pressure inside the sealed space 22c.

Reference numeral 27a designates a fluid supply pipe equipped with a three-way valve 27b for selective supply of a working solution, water, or gas into the sealed space 22c. For this purpose, the valve 27b is connected to a working-solution supply pipe 27c, a water supply pipe 27d, and a gas supply pipe 27e. The pipe 27e may be used for the supply of air or a neutral gas such as dried nitrogen.

Located in the sealed space 22c is a disk-like substrate holder 24 with a central recess 26 having diameter D1 smaller than the diameter D2 of a substrate W. The holder 24 rotated by means of a shaft 28, which may have the same construction and can be driven from the same drive mechanisms as described in aforementioned U.S. patent application Ser. No. 103,015.

The holder 24 can be provided with an edge-grip mechanism 30, which may be of the same type as disclosed in aforementioned U.S. patent application Ser. No. 103,015.

The recess 26 has a recess inlet channel 32, which is formed inside the rotating shaft 28, e.g., along the central line of the shaft 28. The recess also has an outlet channel 34. Since the substrate holder 24 rotates, while the outlet channel is stationary, in FIG. 1 the passage 34 is shown conventionally, and connections between the moveable and stationary parts of the outlet unit are not shown. A tank 38 that contains a heating/cooling medium is connected to a small pump 38b which may be required for decrease of gas pressure in the tank 38. Reference numeral 38a designates a tank temperature control unit, e.g., a thermocouple.

The outlet channel 34 is connected to the cooling/heating liquid tank 38 by a pipe 36. Reference numeral 40 designates a cut-off valve. The inlet channel 32 is connected to a pipe 51, which links the channel 32 to the heater 46 or the cooler 48 via the two-way valve 44. The tank 38 is equipped with a stirrer 42.

The recess inlet channel 32 is connected to a two-way valve 44 and can be selectively connected to the heating/cooling liquid tank 38 via a heater 46 or a cooler 48. A pipe 50 branched from the recess inlet channel 32 is connected to a pressure differential control unit 52 intended for controlling a pressure ratio between the pressure of the working solution in the working chamber 22 and the pressure of the heating/cooling medium in the recess 26. The control unit 52 is a membrane-type device that has a membrane 54 with strain gages 54a and 54b which convert deformations of the membrane 54 into electrical signals sent to a controller 56. The control 56, in turn, is connected to actuating mechanisms (not shown) of the two-way valve 44, the heater 46, the cooler 48, the strain gages 54a, 54b, the thermocouple 38a, the pump 38b, and the control valve 25b.

Reference numeral 58 designates a solution return line with a valve for returning the working solution to the main reservoir of the electroless deposition apparatus (not shown in the present application but illustrated in U.S. patent application Ser. No. 103,015 filed by the same applicant in 2002).

Figure 2:
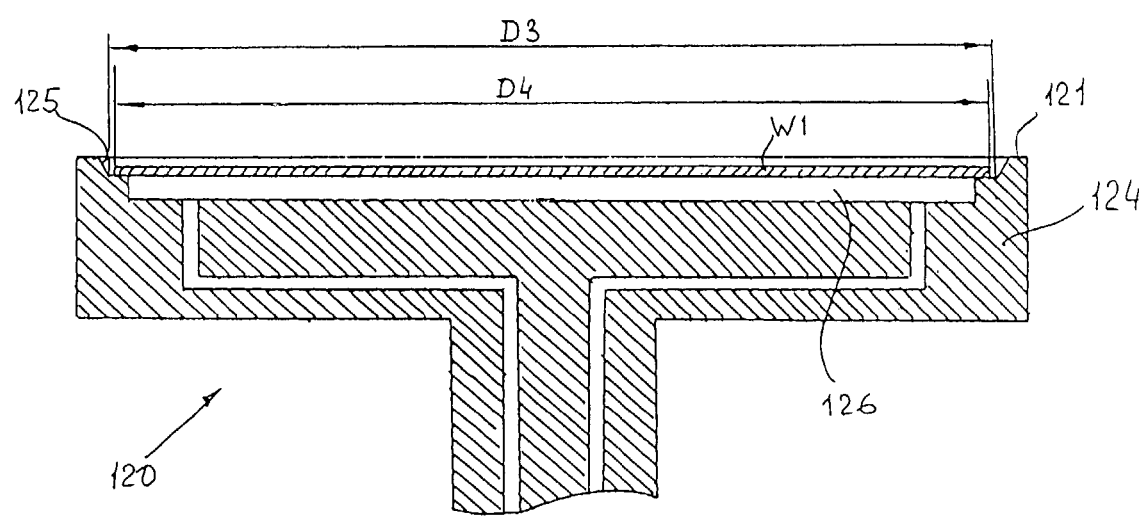
FIG. 2 is a sectional view of a substrate holder used in the apparatus of FIG. 1.

FIG. 2 illustrates a substrate holder 124 made in accordance with another embodiment of the invention. The substrate holder 124 of this embodiment differs from the substrate horder 24 of the embodiment or FIG. 1 by the absence of the edge grippers 30. The upper end face 121 of the substrate holder 124 has a shallow tapered boring 125, which forms a seat for the substrate W1. The diameter D3 on the bottom of the boring 125 is equal to or slightly greater than the diameter D4 of the wafer W1, so that the wafer W1 can be placed into and centered in the boring 125. The rest of the construction or the substrate holder 124 is the same as that of the substrate holder of FIG. 1.

When the substrate W1 is placed into the boring 125, the pressures above the substrate, i.e., in the working chamber, is increased to a level slightly higher than the pressure inside the recess 126 and is sufficient for securing the substrate W1 on its seat and for sealing the heating/cooling recess 126.

It is understood that in this and in all other embodiments of the invention, the substrate holder is equipped with the substrate lifting/descending mechanism (not show in this application) of the type shown in aforementioned U.S. patent application Ser. No. 103,015 and intended for loading of the substrate W into the substrate holder and for lifting it prior to unloading.

It is understood that since the wafer W1 itself forms a wall of the recess 126 for the cooling/heating liquid, the substrate holder 24 (124) shown in FIGS. 1 and 2 provides instant cooling or heating of the substrate, i.e., possesses the feature required for accomplishing the method of the present invention.

More specifically, the method of the invention comprises forming a multiple-layered coating on a substrate, where the aforementioned layers have different structures. These structures are controlled by controlling temperatures of the processes in the stages of the formation of different layers by supplying to the recess 26 (126) a cooling or heating liquid and by controlling the speed of cooling or heating of the liquid, and hence of the wafer or substrate, which is always maintained in direct contact with the cooling/heating liquid. As heating and cooling can be performed without inertia, i.e., almost instantaneously, the apparatus allows heating or cooling in a pulse mode unattainable with apparatus of other known types. For example, instantaneous cooling makes it possible to form in the film layer of a high-quality crystalline structure. In principle, the method of the invention makes it possible to form crystalline, as well as purely amorphous or partially crystalline structures.

The method of the invention can be performed more efficiently with a provision of a preliminarily-accumulated experimental data with regard to the optimal time-temperature relationship of the deposition process in various film-formation stages for various materials. For example, such stages may comprise forming nuclei of a selected material on the surface of the treated object in the first period of deposition under first temperature-controlled conditions for the formation of nuclei of the selected material, converting the nuclei into an island-structured deposited layer of the material by causing lateral growth of the nuclei under second temperature-controlled conditions, converting the island-structure layer into a continuously interconnected cluster structure by causing further lateral growth of the island-structured deposited layer under third temperature-controlled conditions, forming a first continuous film of the material under fourth temperature controlled conditions which provide the first continuous film with predetermined properties, and then completing the formation of a final coating film by growing at least one subsequent continuous film of the material under fifth temperature-controlled conditions until a film of a predetermined thickness is obtained. The fifth temperature-controlled condition may be characterized by a pulse-mode or step-like variations of temperature in time with rapid cooling or heating for obtaining high degree of crystallinity or for increase in the rate of deposition.

Operation pf the Apparatus and Description of the Method

In order to prevent formation of gas bubbles in the recess 26 under a substrate W, prior to placement of the substrate into the substrate holder 20, the latter is first filled with a liquid, e.g., with the cooling or heating liquid (depending on the selected mode of metal deposition and the structure orthe deposited layer) to the level exceeding die upper edge of the recess 26, and only after that the substrate is placed into the holder 20 and, if necessary, is clamped in the holder 20 (FIG. 1). The working chamber 22 is then filled with the working solution. The deposition process is carried out by precipitation of the coating material from the working solution, while the temperature on the surface of the substrate W is controlled by continuing the supply of the heating/cooling medium to the recess 26 (126). (FIGS. 1 and 2). The liquid is uniformly removed from the recess 26 (126) through the medium return line 58.

In order to ensure balance of the pressure inside the recess 26 (126), pressure developed in the working chamber above the substrate W (FIG. 1) can be adjusted by means of gas supplied, e.g., through the gas supply line 25a (FIG. 1), to a value equal to or slightly exceeding the pressure of liquid in the recess 26 (326) on the back side of the substrate W. The pressure in the recess is controlled by the pressure differential control unit 52 (FIG. 1) equipped with the strain gages 54a and 54b which convert deformations of the membrane 54 into electrical signals sent to a controller 56. The controller 56, in turn, is connected to actuating mechanisms (not shown) of the two-way valve 44, the heater 46, the cooler 48, the strain gages 54a, 54b, the thermocouple 38a, the pump 38b, and the control valve 25b. During the operation, the pressure of the working solution in the working chamber 22 above the substrate W is always maintained at a level slightly higher than the pressure inside the recess. This allows performing fixation of the substrate W in the substrate holder 20 without the use of a clamping mechanism, if the holder corresponds to the embodiment shown in FIG. 2.

Given below are several examples of different multiple-layers structures described with reference to graphs illustrating control of the substrate temperature on different stages of the film growth.

Figure 3A:
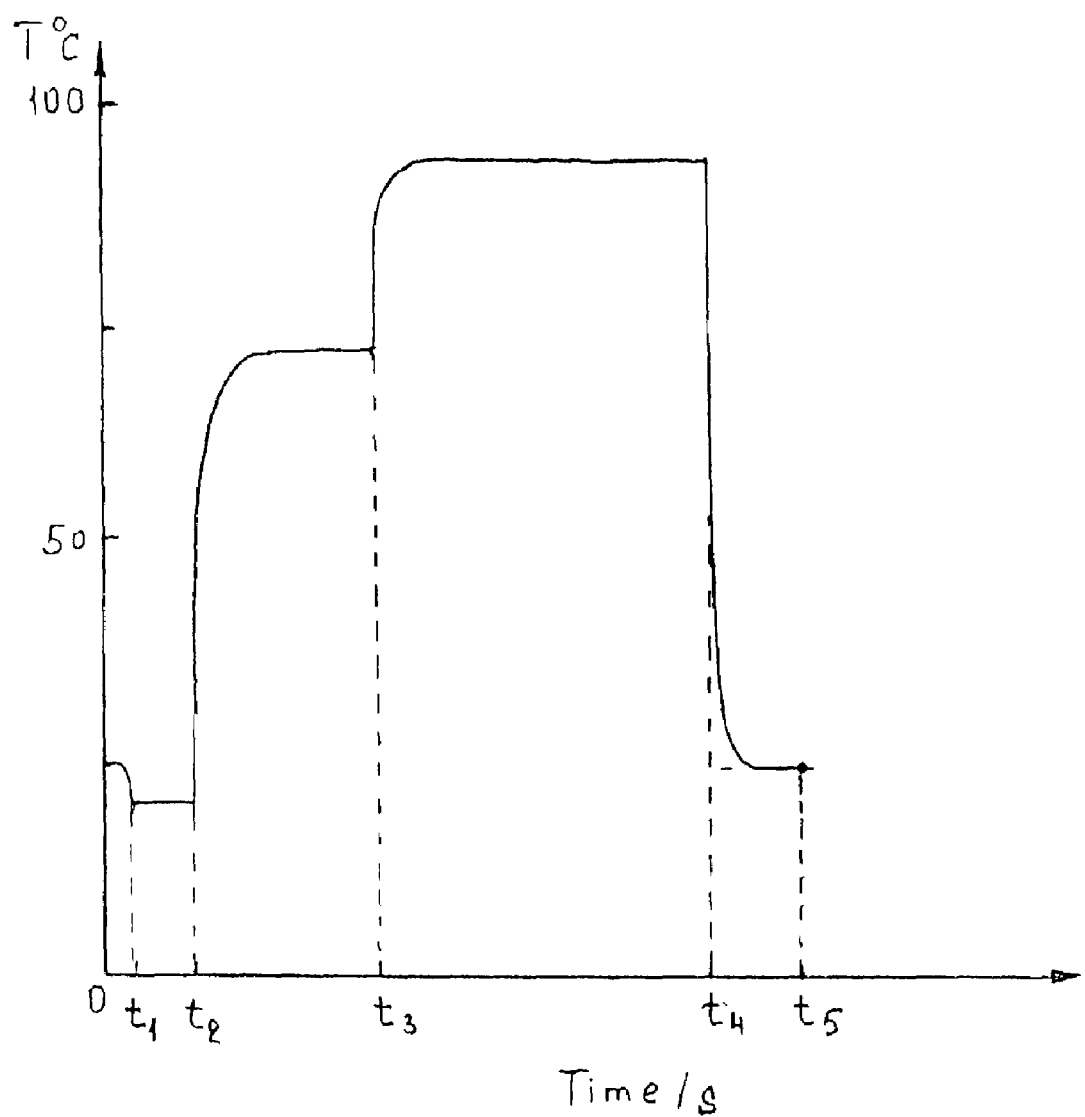
FIG. 3A is a graph illustrating an example of deposition of copper onto a cobalt layer on a dielectric substrate by the method of the invention with variations of the substrate temperature in time.
Figure 4:
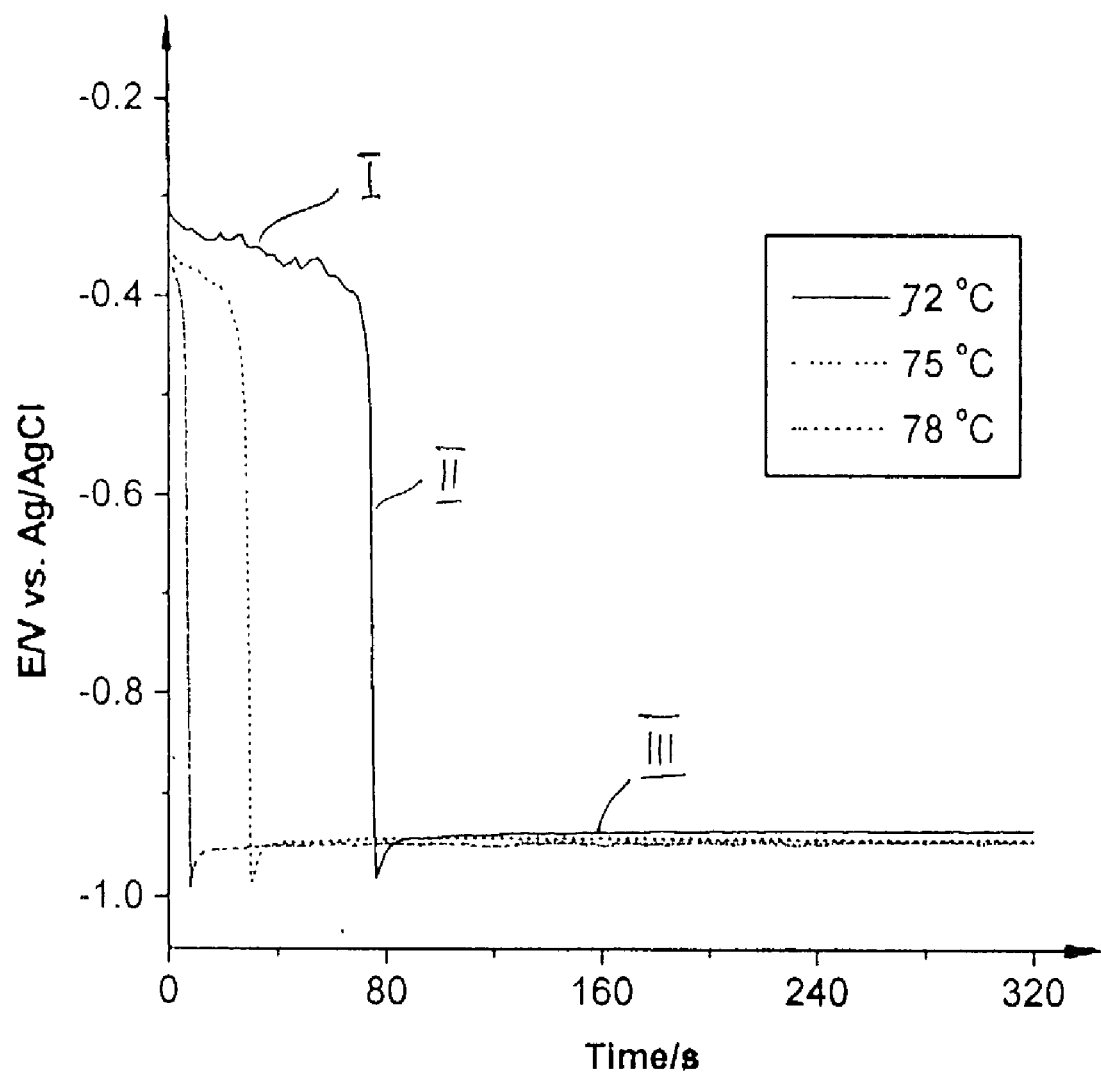
FIG. 4 is a graph illustrating measured variations of electrical potential on the surface of a layer growing during electroless deposition of CoWP onto a copper plate.

FIG. 3A is a graph illustrating an example of a deposition of copper onto a dielectric substrate with variations of the substrate temperature in time. The time t (sec.) is plotted on the abscissa axis, and the temperature T (° C.) is plotted on the ordinate axis. The graph of FIG. 3A describes a complete cycle from initiation of the electroless deposition process till the formation of a continuous coating film of a predetermined thickness. The applicant studied and measured variations of electrical potential on the surface of a layer growing during electroless deposition of CoWP onto a copper layer formed on a dielectric plate. An example of such measurements is shown in FIG. 4. In this graph, the electrical potential is plotted on the ordinate axis, and the time is plotted on the abscissa axis. Three curves shown in this graph relate to three slightly different temperatures of deposition. The curves make it possible to identify different stages of the deposition process. More specifically, the 72° C. curve consists of three distinctly different sections, wherein sections I–II relate to the nucleus and island formation stage. On the section II the potential instantaneously drops to the lowest level. This stage corresponds to the completion of the percolation stage when all the islands become electrically connected into a conductive structure and the intermediate spaces between the islands are filled. In other words, the formation of a continuous film is completed approximately 80 sec. from the beginning of the process. Section III corresponds to the stage with the constant potential, when the growth of the film is continued to a predetermined thickness. Normally, sections I and II are known as the initial period of the film formation (stages of formation of nuclei, islands, and the first continuous layer), and the time corresponding to the above period is called Initiation time. It is clearly seen that transfer from 78° C. to 75° C. and then to 72° C. changes the initiation time from 80 sec. to 35 sec. and then to 8 sec., respectively.

Looking at the graph of FIG. 4, one can think that the structure can be easily adjusted merely by increasing the process temperature: the higher is the temperature, the shorter is the initiation time, and the higher is efficiency of the process. However, in reality the film growth process is more complicated since during the aforementioned initial time the deposition grows not only in the lateral direction but also in the direction perpendicular to the plane of the substrate. As a result, the nuelisi may grow significantly in a vertical direction so that the initial continuous layer may have significant surface roughness. This initial roughness will be reproduced in the subsequent layer, and even the final layer will reflect this roughness and will have a noticeable $H_{RMS}$ (the height of microroughnesses on the surface of the film). The method of the invention is aimed particularly at the selection at such temperatures and time intervals in different deposition stages for specific materials of the substrate and deposition materials, which provide the minimal rate of growth in the vertical direction and the maximal rate of growth in the lateral direction.

Kinetics similar to the one observed in FIG. 4 can also be noticed in the growth of copper on a cobalt layer. Although it is understood that in each specific case, the initial time of film formation and the time required for the formation of the basic film will depend on such factors as composition, concentration, pH and other characteristics of the working solution, in both eases, variations of electrical potential on the surface of a layer growing during electroless deposition will be approximately the same.

Referring back to FIG. 3A, for the case of deposition of Cu onto an activated cobalt layer, the time interval from 0 to $t_1$ is the one during which the initial process temperature, e.g., 20° C., is established. The time interval from $t_1$ to $t_2$ may constitute a nucleus formation period, which normally lasts a few seconds. The time interval from $t_2$ to $t_3$ is a period during which islands are formed and connected into clusters. This period may last about 25 sec. In the illustrated case, the temperature instantaneously grows to a value of 70° C., which was selected from the graphs of FIG. 4 as the most optimal temperature. In the subsequent period from moment $t_3$ to moment $t_4$, which may require from 30 to 60 sec., the temperature may be raised to 95° C. for growth of the film to a required thickness. The process described above makes it possible to grow films having thickness from 250 to 400 Å, and greater.

Figure 3B:
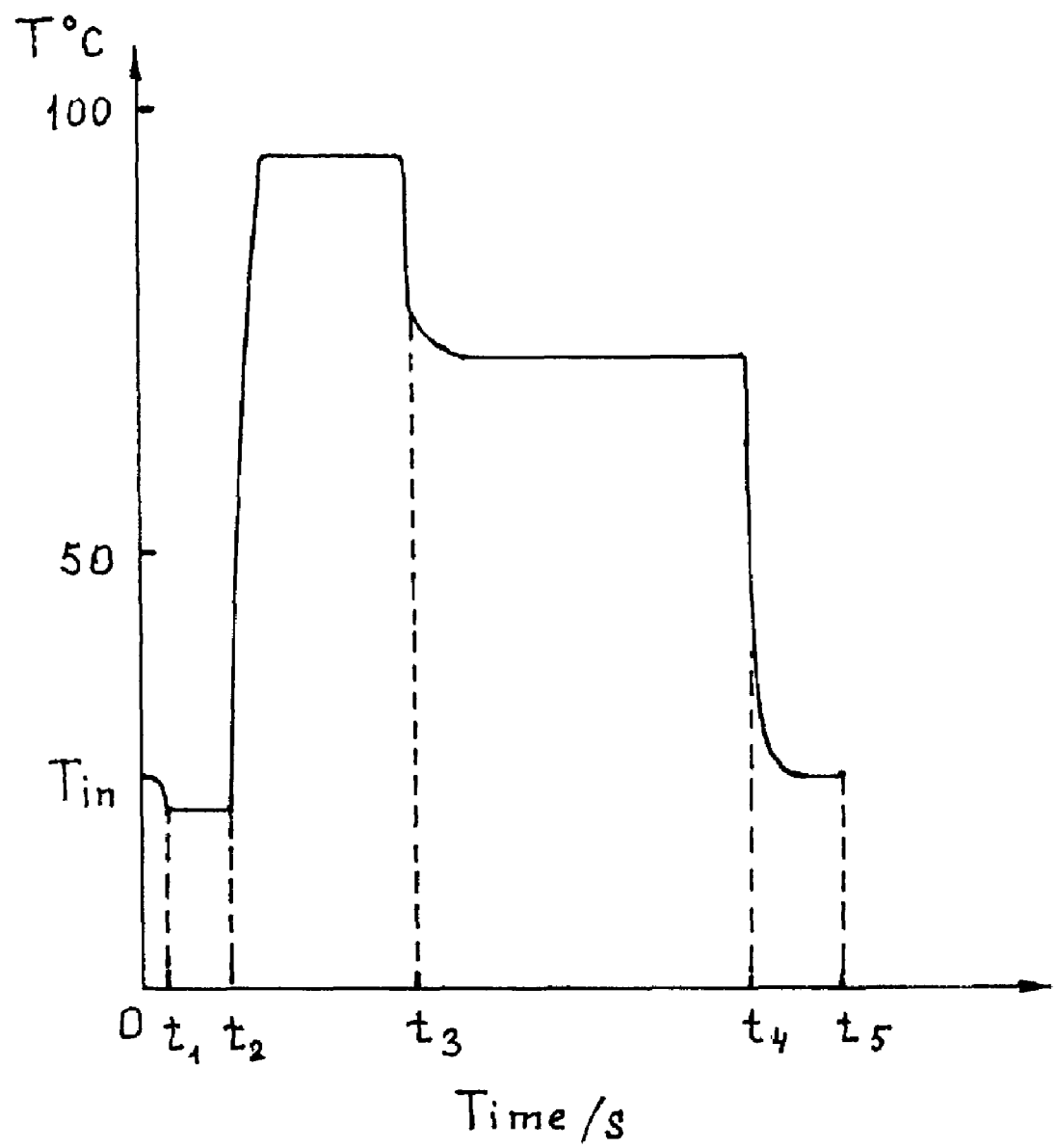
FIG. 3B is a graph similar to FIG. 3A illustrating application of the method of the invention for deposition of a CoWP barrier layer onto a dielectric substrate.

FIG. 3B is a graph similar to FIG. 3A illustrating application of the method of the invention for deposition of a CoWP barrier layer onto a dielectric substrate. It is known that an amorphous structure is the one preferably for a barrier layer. It is also known that amorphous structures are formed at relatively low temperatures. This condition is reflected in FIG. 3B where the initial period of deposition ($t_2$ to $t_3$) occurs at relatively high temperatures (about 90° C. in the example of FIG. 3B), while the amorphous layer is formed at about 70° C. Such sequential formation of a basic copper layer over a preliminarily formed barrier layer can be realized with especially high efficiency if both layers are grown in the same single-wafer processing chamber.

Figure 5:
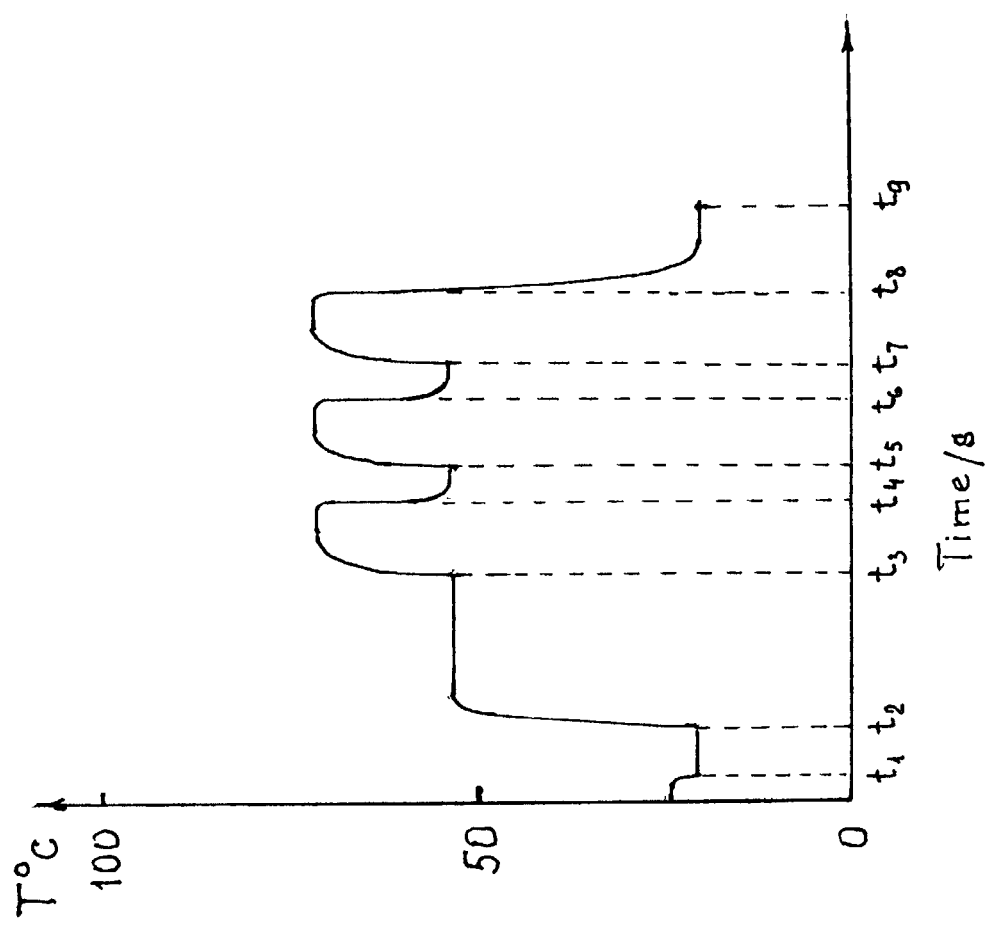
FIG. 5 is a time-temperature relationship illustrating the deposition process of the invention with control of structures in individual layers of a multiple-layered coating film.

FIG. 5 is a time-temperature relationship illustrating the deposition process with control of structures in individual layers of a multiple-layered coating film. More specifically, the aforementioned individual layers have different structures. The initial continuous coating layer is shown with the same periods and stages of the film formation (period from 0 to $t_3$) as in FIG. 3A. The subsequent stages from $t_3$ to $t_8$ correspond to a pulse mode of film growth with temperature pulses having different amplitudes and different durations of time intervals between the temperature pulses. In other words, the process of the type shown in FIG. 5 makes it possible to obtain a coating film of a laminated structure with different thicknesses and structures of individual layers. For example, the layers may be separated by sublayers (formed during intervals $t_4$ to $t_5$ and $t_6$ to $t_7$) having the same stoichiometry but different degrees and nature of crystallinity.

Figure 6:
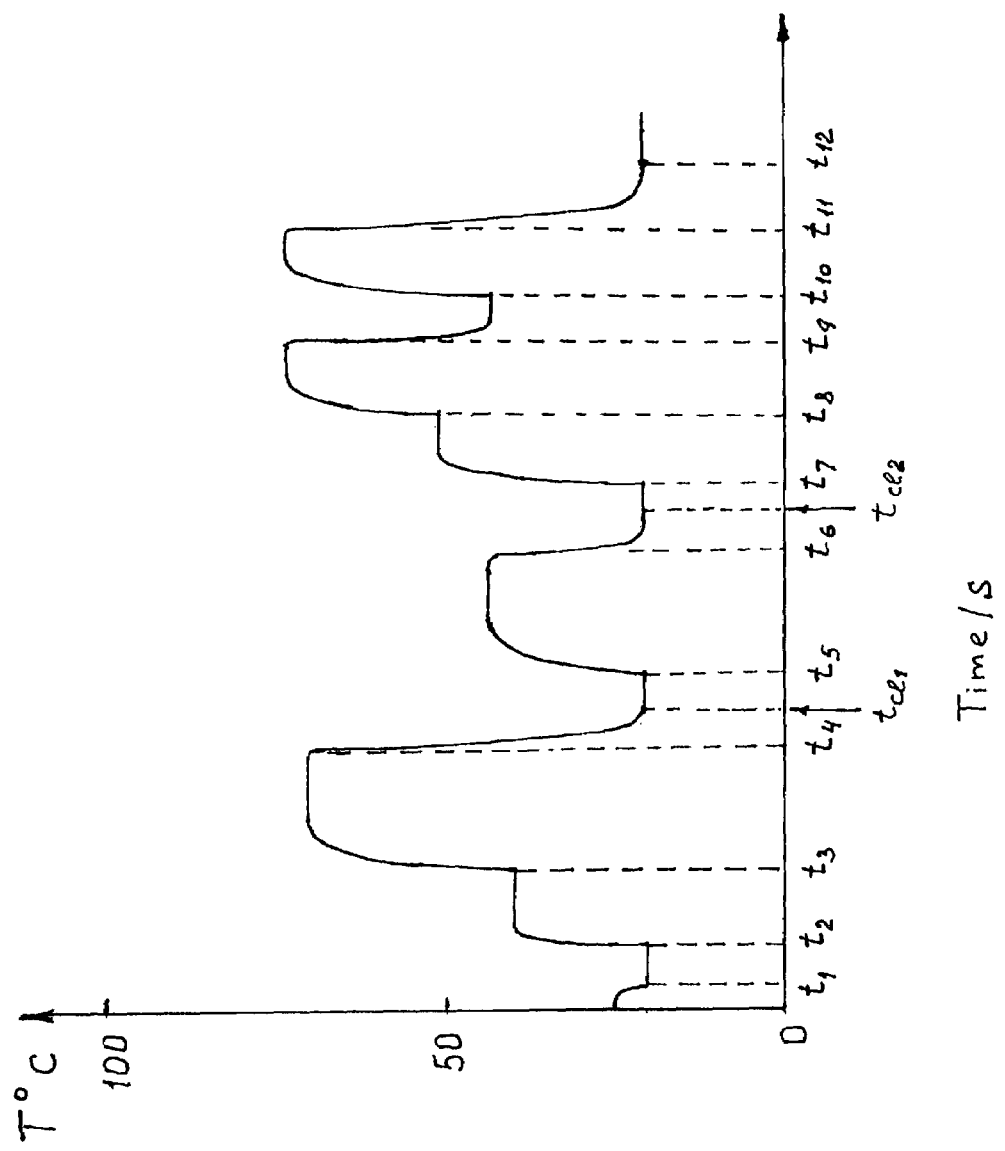
FIG. 6 illustrates a process of the invention for the formation of a multiple-layered structure, wherein individual layers of the coating film are formed from different deposition materials of a metal or non-metal nature.

FIG. 6 illustrates a process of formation of a multiple-layered structure, wherein individual layers of the coating film are formed from different deposition materials of a metal or non-metal nature. In general, the graph is similar to the one shown in FIG. 5, but differs from it by inclusion of a cleaning period between the deposition of different materials. These cleaning period from $t_{cl1}$ to $t_{cl2}$ is needed for replacement of the deposition solution in the sealable working chamber 22 (FIG. 1). It is understood that during cleaning the substrate is maintained at $T_{cl}$ temperature required for optimization of cleaning. After complete removal of the residue of the first deposition solution, a new deposition solution is supplied to the sealable working chamber during period from $t_7$ and $t_{cl2}$. It is understood that during deposition of a new material from the new solution during period from $t_7$ to $t_{12}$ (FIG. 6), the initial deposited film functions as a substrate. It is also understood that all optimal temperatures and time intervals will be different from those for deposition of the first layer. It can be seen that the second layer is deposited with a pulse mode of temperature variation.

Thus it has been shown that the present invention provides a method of electroless deposition of very thin films of high uniformity without thermal decomposition of the working solution and with accurate control of the process depending on the condition of the film structure on various stages of the deposition processing. The method is suitable for electroless deposition with impulse heating and cooling for optimization of the structure of the film obtained in various stages of the deposition. The method can be carried out with the use of an electroless-deposition apparatus that allows instantaneous heating and cooling of the substrate and produces thin deposition films of high uniformity and of the highest quality.

The invention has been shown and described with reference to specific embodiments, which should be construed only as examples and do not limit the scope of practical applications of the invention. Therefore any changes and modifications in technological processes, constructions, materials, shapes, and their components are possible, provided these changes and modifications do not depart front the scope of the patent claims. For example, the process can be carried out in any other processing apparatus that provides instantaneous heating/cooling. The temperature-versus-time graphs should be considered as illustrative and the temperature pulses, their amplitudes, and durations may be different. The layers may be formed from metals or non-metals, and from crystalline and amorphous materials. The coating films may have a multiple-layered structure composed of various materials and their combinations. The films may have different thicknesses. Although the term "structure" was used as a distinguishing feature of each individual layer, it is understood that this term should be construed as "characteristic" of the layer, since the method of the invention makes it possible to change not only the physical structure but also electrical characteristics or the like.

The invention claimed is:

1. A method of forming a film on an object, said method comprising:
   positioning the object within an electroless deposition apparatus having means for instantaneous temperature control of said object;
   electrolessly depositing a material upon the object;
   instantaneously changing the temperature of said object by said means of instantaneous control at one or more predetermined times during the step of electrolessly depositing the material, wherein the predetermined times correspond to different film-growth stages of the material, wherein the different film-growth stages comprise:
      a first stage in which nuclei of the material are formed on said object;
      a second stage in which the nuclei are converted into an interconnected cluster structure; and
      a third stage in which the interconnected cluster structure is converted into a continuous layer
   cleaning said object subsequent to the step of electrolessly depositing the material upon the object; and
   depositing a plurality of layers having different physical characteristics onto said contiguous layer subsequent to the step of cleaning the object, each one of said plurality of layers being deposited within a temperature range for obtaining its respective different physical characteristics.

2. The method of claim 1, wherein said film comprises an amorphous structure.

3. The method of claim 1, wherein said object is a semiconductor substrate.

4. The method of claim 1, wherein said different physical characteristics comprise different degrees and nature of crystallinity.

5. The method of claim 1, wherein said different physical characteristics comprise different deposition materials.

6. The method of claim 1, wherein said different physical characteristics comprise different thicknesses.

7. The method of claim 1, wherein the step of depositing the plurality of layers comprises instantaneously changing the temperature of the object by the means of instantaneous control at one or more predetermined times corresponding to different film-growth stages of at least one of the plurality of layers.

8. The method of claim 1, further comprising replacing a deposition solution within the electroless deposition apparatus between depositing at least two of said plurality of layers.

9. The method of claim 1, wherein at least one of said plurality of layers comprises a crystalline structure.

10. The method of claim 1, wherein said instantaneous control of temperature comprises changing the temperature of said object during a period of time ranging from fractions of a second to several seconds.

11. The method of claim 1, wherein the step of depositing the plurality of layers comprises pulsing the temperature of said object.

12. A method of forming a film of at least one deposition material on an object in an electroless deposition process, said method comprising:
   forming nuclei of the deposition material on a surface of said object under first temperature-controlled conditions and during a first period of time;
   converting said nuclei into island structures during a second period of time and under second temperature-controlled conditions distinct from the first temperature conditions, wherein the step of converting said nuclei comprises growing said deposition material substantially in a lateral direction from said nuclei parallel to said object;
   converting said island structures into an interconnected cluster structure by causing further lateral growth of said island structures under third temperature-controlled conditions;
   forming a first continuous layer of said deposition material under fourth temperature controlled conditions distinct from the third temperature-controlled conditions; and
   forming a coating layer upon the first continuous layer under fifth temperature-controlled conditions.

13. The method of claim 12, further comprising instantaneously changing the temperature of said object between the steps of:
   forming nuclei of the deposition material and converting the nuclei into island structures; and
   converting the island structures into the interconnected cluster structure and forming the first continuous layer of the deposition material, wherein said instantaneously changing the temperature of the object comprises changing the temperature of the object during a period of time ranging from fractions of a second to several seconds.

14. The method of claim 12, wherein the fourth temperature-controlled conditions comprise a higher temperature range than the third temperature-controlled conditions.

15. The method of claim 12, wherein the fourth temperature-controlled conditions comprise a lower temperature range than the third temperature-controlled conditions.

16. The method of claim 12, further comprising forming one or more intermediate layers above the first continuous layer prior to the step of forming the coating layer, wherein the step of forming the one or more intermediate layers comprises pulsing the temperature of the object.

17. A method for forming a film on an object, comprising pulsing the temperature of the object between at least two distinct temperature ranges during a continuous electroless deposition process of the film.

18. The method of claim 17, further comprising:
   depositing nuclei of a deposition material on a surface of said object at a first temperature;
   depositing the deposition material at a second temperature distinct from the first temperature to interconnect the nuclei; and
   depositing the deposition material at a third temperature distinct from the second temperature to form a continuous layer on the surface prior to the step of pulsing.

19. The method of claim 18, wherein the step of pulsing comprises depositing layers of the deposition material having different degrees and nature of crystallinity.

* * * * *